(12) United States Patent
Kang et al.

(10) Patent No.: US 6,361,917 B1
(45) Date of Patent: Mar. 26, 2002

(54) PROCESS FOR PATTERNING POLY (ARYLENEVINYLENE) POLYMER FILMS BY IRRADIATION WITH LIGHT

(75) Inventors: Wen-Bing Kang; Nu Yu; Akihiko Tokida, all of Kawagoe (JP)

(73) Assignee: Hoechst Aktiengesellschaft, Frankfurt am Main (DE)

( * ) Notice: Subject to any disclaimer, the term of this patent is extended or adjusted under 35 U.S.C. 154(b) by 0 days.

(21) Appl. No.: 08/681,117

(22) Filed: Jul. 22, 1996

Related U.S. Application Data

(63) Continuation of application No. 08/519,825, filed on Aug. 25, 1995, now abandoned.

(30) Foreign Application Priority Data

Aug. 29, 1994 (JP) .............................................. 6-203322

(51) Int. Cl.[7] .................................................. G03C 5/16
(52) U.S. Cl. .......................... 430/139; 430/5; 430/311; 430/290; 430/321; 430/320
(58) Field of Search .............................. 430/139, 5, 311, 430/320, 321, 290

(56) References Cited

U.S. PATENT DOCUMENTS

| | | | |
|---|---|---|---|
| 5,053,166 A | * | 10/1991 | Murase et al. .............. 252/500 |
| 5,328,809 A | * | 7/1994 | Holmes et al. ............. 430/321 |
| 5,425,125 A | * | 6/1995 | Holmes et al. ............. 430/321 |

FOREIGN PATENT DOCUMENTS

| WO | WO 92/03491 | 3/1992 |
|---|---|---|
| WO | WO 93/14177 | 7/1993 |

OTHER PUBLICATIONS

Materials Research Society Symposium Proceedings, vol. 247 by Burns et al., entitled "Light Emitting Diodes Based on Conjugated Polymers"Control of Colour and Efficiency, pp. 647–654.

* cited by examiner

*Primary Examiner*—Geraldine Letscher
(74) *Attorney, Agent, or Firm*—Frommer Lawrence & Haug LLP

(57) ABSTRACT

A process for forming a pattern which comprises irradiating with light a film of a poly(arylenevinylene) polymer represented by the following formula (I)

$$-(Ar-CR^1=CR^2)_n- \qquad (I)$$

wherein Ar is a substituted or unsubstituted divalent aromatic hydrocarbon group or a substituted or unsubstituted divalent heterocyclic ring group, and the aromatic hydrocarbon group and the heterocyclic ring group may be a fused ring, $R^1$, $R^2$ independently of each other, are H, CN, alkyl, alkoxy are substituted or unsubstituted aromatic hydrocarbon groups or substituted or unsubstituted aromatic heterocycles, which may both be fused rings, and n is an integer of 2 or more. It is preferred that either $R^1$ or $R^2$ is H and more preferred that both $R^1$ and $R^2$ are H.

8 Claims, 4 Drawing Sheets

Light-Emission

Light-Emission

Device in which a half area has been irradiated with light

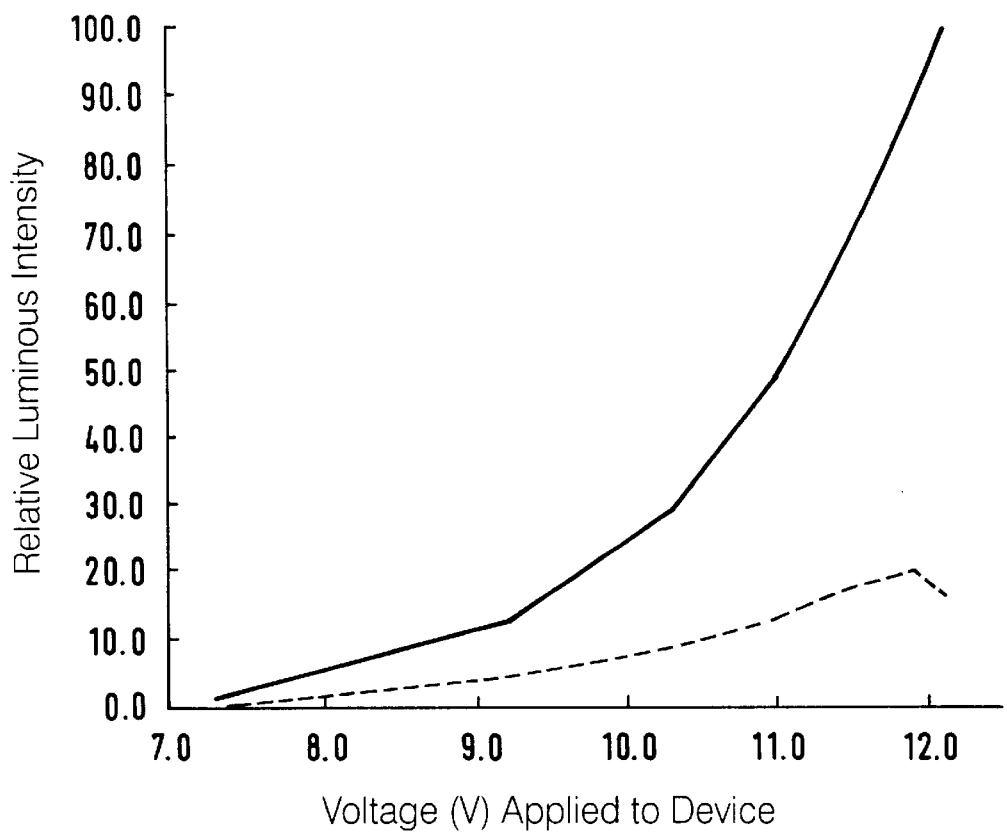

PROCESS FOR PATTERNING POLY (ARYLENEVINYLENE) POLYMER FILMS BY IRRADIATION WITH LIGHT

This application is a continuation of application Ser. No. 08/519,825, filed Aug. 25, 1995, now abandoned.

TECHNICAL FIELD

This invention relates to a process for patterning a polymer film by irradiation with light, a patterned polymer film produced by the process, and an organic electroluminescent device (hereinafter referred to as "organic EL device") comprising the patterned polymer film.

BACKGROUND ART

Hitherto, organic EL devices having a two-layer structure as shown in FIG. 1 in which a light-emitting layer 2 and a hole transport layer 3 in a layered structure, each comprising an organic compound, are placed between a metal cathode 1 and a transparent anode 4 formed on a transparent substrate 5, and organic EL devices having a three-layer structure as shown in FIG. 2 in which an electron transport layer 6, a light-emitting layer 2 and a hole transport layer 3 in a layered structure, each comprising an organic compound, are placed between a metal cathode 1 and a transparent anode 4 have been known. In the above device, the hole transport layer 3 has the function to facilitate the hole-injection from the anode and also to block electrons, and the electron transport layer 6 has the function to facilitate electron-injection from the cathode and also to block holes.

In these organic electroluminescent devices, ITO (indium tin oxide) is mainly used as a transparent electrode 4, and a film of ITO is formed on a glass substrate 5. By recombination of the electron injected from the metal cathode 1 and the positive hole injected into the light-emitting layer from the anode, light emitted in the process of a radiative decay of the produced exciton is taken out through the transparent anode and the transparent glass substrate.

The organic materials used in these organic EI devices include low molecular weight dyes, dyes dispersed in a polymer, conjugated type polymer materials, for example, so-called poly(arylenevinylene) polymers. Particularly, in recent years, the conjugated type polymer materials have been extensively studied due to their easy processing. These poly(arylenevinylene) polymers are utilized in organic EL devices in a single layer or in a layered structure combined with other electron transport layers. Details of organic electroluminenscence are described in, for example, the following literature references:

(1) "Organic EL Device Development Strategy", compiled by Next Generation Display Device Research Association, Science Forum (published 1992)
(2) "Electroluminescent Materials, Devices, and Large-Screen Displays", SPIE Proceedings Vol. 1910 (1993), E. M. Conwell and M. R. Miller.

In order to utilize an organic EL device using a poly (arylenevinylene) polymer film as a display such as a panel, patterning of the polymer film is required. For this purpose, a method for vapor-depositing an electrode pattern on the polymer film, and a method disclosed in WO92/03491 (International Publication No. Hei-6-501035) are known. The method disclosed in WO92/03491 comprises forming a film of an intermediate polymer of a conjugated type polymer, vapor-depositing a metal pattern on the polymer film, and converting the intermediate polymer into a conjugated polymer by heat treatment. In this method, since the acid generated by the heat treatment in a portion having the metal pattern is not easily removed from the film, a catalytic activity of the acid causes a difference in the conversion efficiency between the portion where there is no metal pattern and that where the polymer film is patterned.

However, in the method for patterning the above-described poly(arylenevinylene) polymer, it is complicated to vapor-deposit a metal pattern on the intermediate polymer and, depending upon the shape of patterns, a mask for vapor-deposition sometimes cannot be prepared. Thus, it has been desired to develop an easier method for patterning.

An object of the present invention is to provide a more expedient process for patterning a film of a poly (arylenevinylene) polymer.

Another object of the present invention is to provide a patterned film of the polymer produced by the process for patterning.

A further object of the present invention is to provide an organic EL device comprising the patterned film of the polymer.

DISCLOSURE OF THE INVENTION

The above objects can be achieved by the present invention hereinafter described in detail.

Generally, it is known that, upon irradiation with light from ultraviolet rays to visible light, a polymer having vinyl groups undergoes a crosslinking reaction due to addition reactions of the double bond, cis-trans isomerization reactions and the reaction with oxygen, though the type of reaction varies depending upon the structure of the polymer.

The present inventors found that, when a film of a poly(arylenevinylene) polymer of the formula (I) is irradiated with light such as that from a xenon lamp, the fluorescence intensity of the portion irradiated with light decreases in stages depending upon the light irradiation time and the light intensity used in the light irradiation. By utilizing the above finding, a difference in the fluorescence intensity between a light-irradiated portion and a light-unirradiated portion can be easily established on the film of poly (arylenevinylene) polymer. Thus, according to the present invention, it is possible to provide a poly(arylenevinylene) polymer film having a pattern of the desired fluorescence intensity as well as an organic electroluminescent device using such a patterned film of poly(arylenevinylene) polymer.

The poly(arylenevinylene) polymer according to the present invention is represented by the following general formula (I):

$$—(Ar—CR^1=CR^2)_n— \quad (1)$$

wherein Ar is a substituted or unsubstituted divalent aromatic hydrocarbon group or a substituted or unsubstituted divalent heterocyclic ring group, and the aromatic hydrocarbon group and the heterocyclic ring group may be a fused ring, $R^1$, $R^2$ independently of each other, are H, CN, alkyl, alkoxy are substituted or unsubstituted aromatic hydrocarbon groups or substituted or unsubstituted aromatic heterocycles, which may both be fused rings, and n is an integer of 2 or more. It is preferred that either $R^1$ or $R^2$ is H and more preferred that both $R^1$ and $R^2$ are H.

There is no specific limitation in "n" as long as it is an integer of 2 or more, but n is preferably from 5 to 30,000, and more preferably from 10 to 10,000.

BRIEF DESCRIPTION OF DRAWINGS

FIG. 6 is a graph showing the difference in the light-emitting intensity between the light-unirradiated portion and the light-irradiated portion in the organic EL device obtained in Example 3.

BEST MODE FOR CARRYING OUT THE INVENTION

Figure 1:
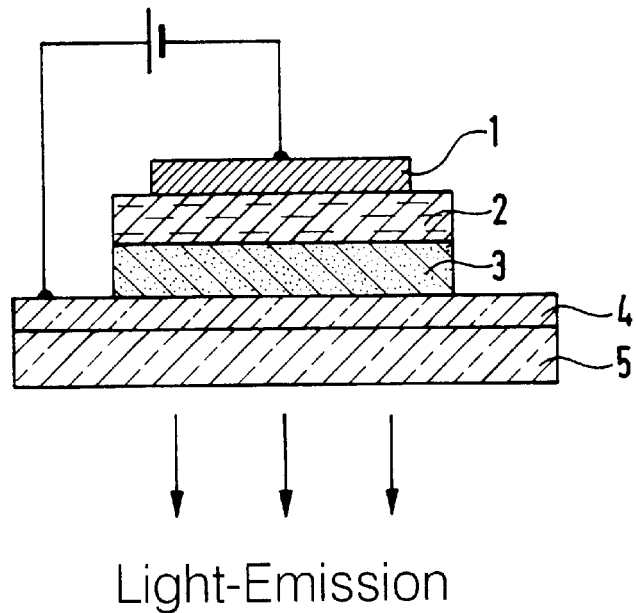
FIG. 1 is a cross-sectional drawing of an example of an organic EL device in which a light-emitting layer and hole transport layer in a layered structure, each comprising an organic compound, are placed between a metal cathode and a transparent anode formed on a transparent substrate.
Figure 2:
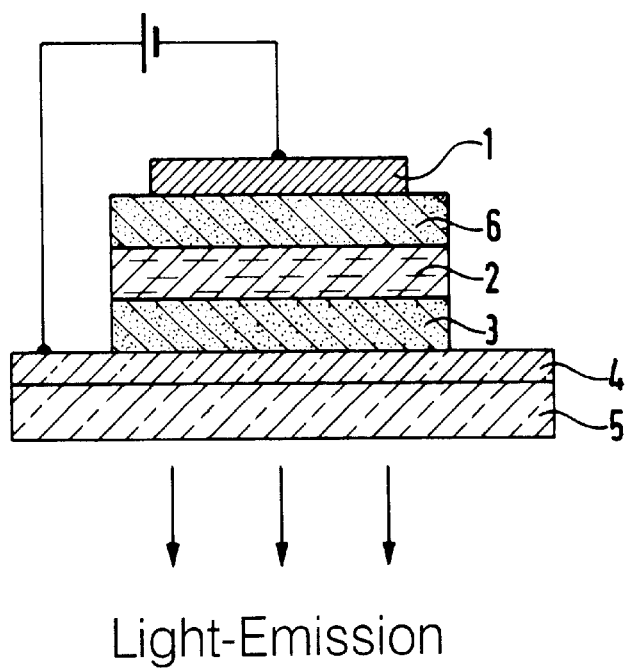
FIG. 2 is a cross-sectional drawing of an example of an organic EL device in which an electron transporting layer, a light-emitting layer and hole transporting layer in a layered structure, each comprising an organic compound, are placed between a metal cathode and a transparent anode formed on a transparent substrate.

In the present invention, the light-irradiation treatment can be performed by a general method which comprises light irradiating a film of a poly(arylenevinylene) polymer through a mask. The poly(arylenevinylene) polymer film to be irradiated may be a film of the polymer alone or a film formed on a support (for example, a glass substrate, a metal plate or a polymer film). The poly(arylenevinylene) polymer film which has been patterned by the light-irradiation treatment according to the present invention can be used for organic EI devices, fluorescent image display sheets, recording films using a fluorescent pattern and the like. Further, by using the method for forming a pattern according to the present invention, a light waveguide can be formed on a film of the poly(arylenevinylene) polymer.

Patterning by irradiation with light may be performed at any stage after formation of the poly(arylenevinylene) polymer film. There is no particular restriction in the wavelength and the light source of the irradiation light. It is possible to use light from a xenon lamp directly without passing it through a light filter. Alternatively, light from a mercury lamp may be used. It is preferred to use light having a wavelength which can be absorbed by the film in air.

In the case of utilizing the patterned poly(arylenevinylene) polymer film of the present invention in an apparatus such as an organic EL device, if the light having a wavelength which affects the fluorescence intensity of the film, for example, light having a wavelength absorbable by the film, or light having a wavelength which promotes the oxidation reaction with oxygen is present in an environment where the apparatus is used, the life of the patterned poly(arylenevinylene film can be prolonged by mounting an appropriate material or unit onto the apparatus in which the patterned poly(arylenevinylene) polymer is used. Such a material or unit includes a material which reflects the light having the specific wavelength, for example, an inorganic transparent reflection film, a material which absorbs the above-described light, for example, a specific organic polymer material, a material comprising a dye dispersed in a polymer, or a material or unit which prevents the patterned film of the present invention from being exposed to the light.

The poly(arylenevinylene) polymer used in the present invention can be synthesized by known methods. For example, the method described in the following references can be used for synthesis thereof.

1) R. A. Wessling and R. G. Zimmerman, U.S. Pat. No. 3,706,677
2) I. Murase et al, Synth. Met., 17, 639 (1987)
3) S. Antoun et al, J. Polym. Sci., Polym. Lett. Ed., 24, 504 (1986)
4) I. Murase et al, Polym. Commun., 1205 (1989)
5) Japanese Patent Publication (Kokai) Nos. Hei-1-254734 and Hei-1-79217

The poly(arylenevinylene) polymers used in the present invention can be grouped into two types, i.e., solvent-soluble polymers and solvent-insoluble polymers. In the case of a solvent-soluble polymers, it is dissolved, after synthesis and purification of the polymer, in an organic solvent in which the polymer is soluble, and the resulting solution is coated onto a substrate by, for example, spin-coating to make a film of the polymer on the substrate. In the case of a solvent-insoluble polymer, a film can be formed by using a solution of a corresponding intermediate polymer which is soluble in a solvent by, for example, spin-coating, and the intermediate polymer is then converted into a conjugated polymer by heat-cleavage, preferably, in vacuum. For example, a bis-sulfonium salt obtained by reacting 1,4-bischloromethylbenzene and tetrahydrothiophene as shown in the following reaction scheme of the Wessling synthesis method can be reacted with alkali in a mixed solvent of water and methanol to obtain an intermediate polymer which is soluble in methanol. A methanol solution of the resulting intermediate polymer can be coated onto a substrate, for example, a transparent ITO glass substrate, by spin-coating to form a film, and the substrate coated with the intermediate polymer can then be heated (generally at 250° C. or more) for several hours in vacuum to prepare a film of an unsubstituted poly(phenylenevinylene) on the substrate.

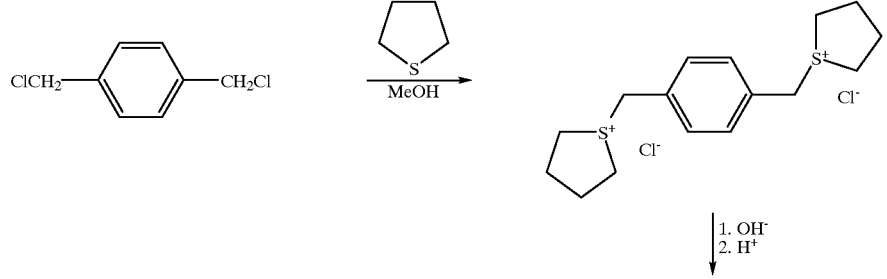

-continued

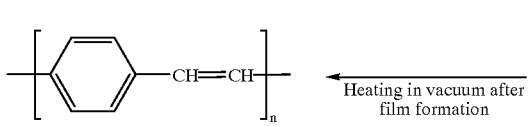 ← Heating in vacuum after film formation 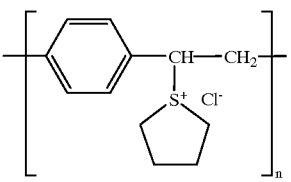

Examples of the poly(arylenevinylene) polymer used in the present invention are shown below.

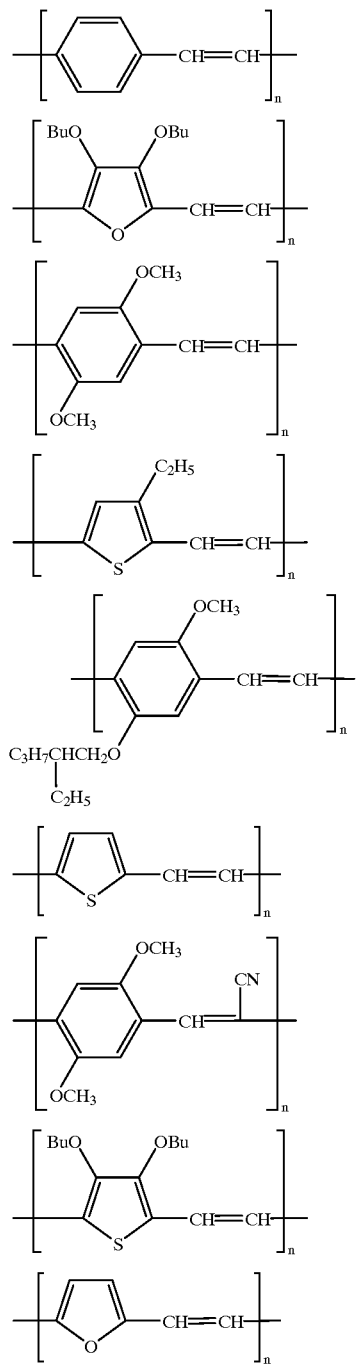

The thickness of the polymer film of the present invention can be optionally selected depending upon the utility thereof. For example, when the film is used as a fluorescent sheet, etc., the thickness is preferably 50 μm or less. When the film is used as an EL device, the thickness is generally 1,000 nm or less, preferably from 1 nm to 500 nm, and more preferably from 10 nm to 200 nm.

The present invention is further illustrated by the following examples, but these examples are not construted to limit the scope of the present invention.

EXAMPLE 1

Irradiation of Poly(arylenevinylene) Polymer Film with Light

An intermediate polymer represented by the formula (II) below synthesized by the synthesis method shown above was dissolved in methanol, and the resulting solution was spin-coated on a well-rinsed glass substrate. Then, the coated glass substrate was heated at 300° C. in vacuum for 8 hours to make a film of poly(phenylenevinylene) having a thickness of 100 nm. The film was irradiated with light from a xenon lamp (output: 800 W) for one hour in air at room temperature to compare changes in absorption spectrum and fluorescence spectrum before and after irradiation. With respect to the absorption spectra, it was found that, after the irradiation with light, an absorption peak in the vicinity of 430 nm on the side of shorter wavelengths slightly increased. On the other hand, with respect to the fluorescence spectrum at the excited wavelength of 360 nm, if the fluorescence intensity at 556 nm before irradiation was assumed to be 100, the fluorescence intensity after irradiation was found to be 13.

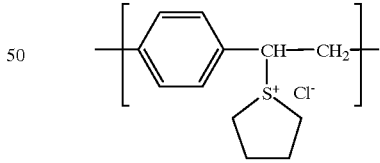

(II)

A film of poly(phenylenevinylene) prepared in the same manner as described above was irradiated with light from a xenon lamp under the same conditions as described above through a mask on which letters were written in an opaque ink, for example, a mask prepared by printing figures such as letters on a transparent plastic film. Thereafter, the film was exposed to ultraviolet rays having a wavelength of 364 nm. The portion that was not irradiated with the light of the xenon lamp, i.e., the portion patterned with the figures, emitted strong fluorescence whereby the formation of a fluorescence pattern was ascertained.

Figure 3:
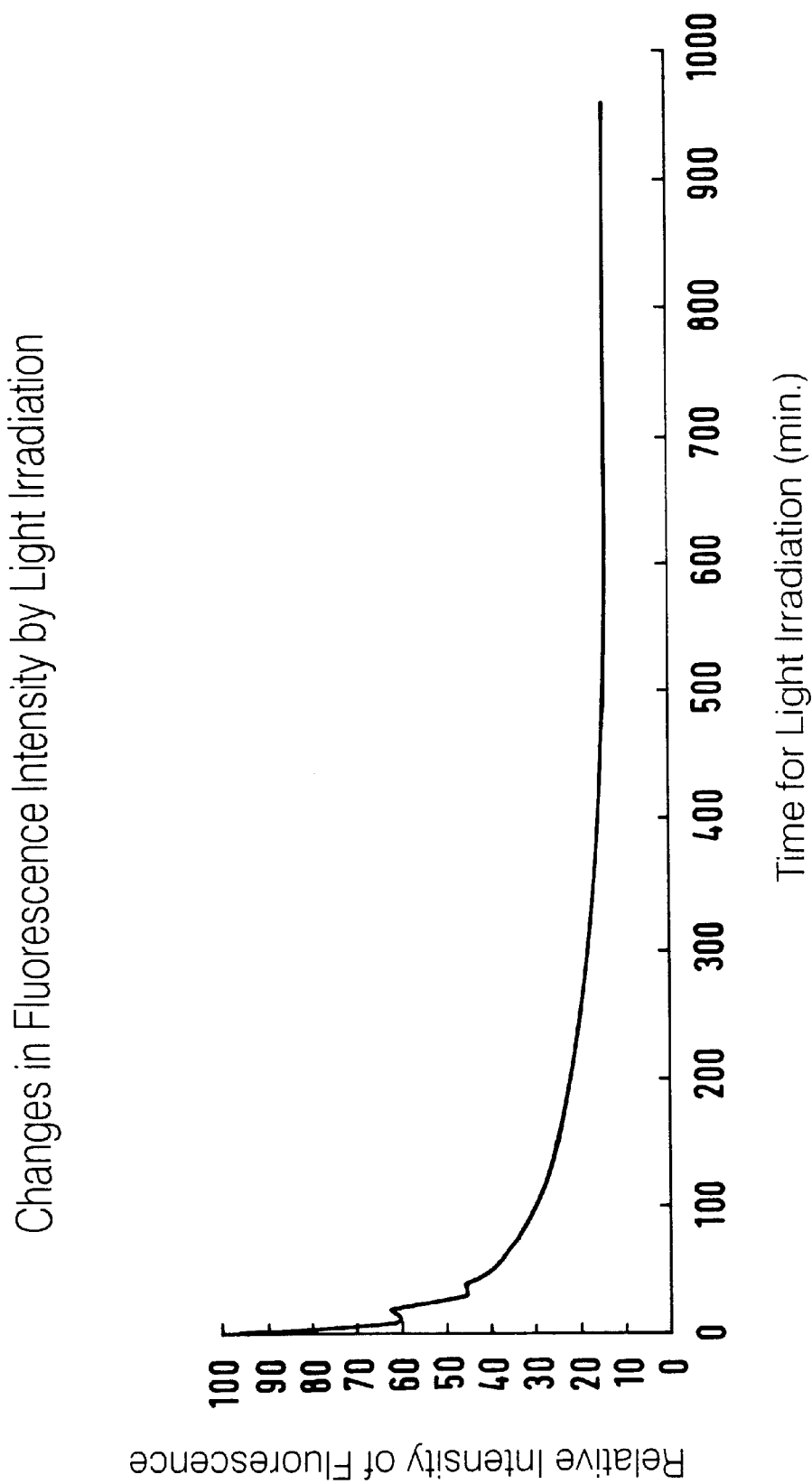
FIG. 3 is a graph showing a relationship between the light irradiation time and the fluorescent intensity.

EXAMPLE 2
Changes in Fluorescence Intensity with Time by Irradiation with Light A film of poly(phenylenevinylene) (a film thickness of 100 nm) was made on a glass substrate, and the resulting film was irradiated with light from an xenon lamp having an output of 400 W in air at room temperature, and changes in the fluorescence intensity at the excited wavelength of 360 nm were measured. The relative intensity at a fluorescence peak wavelength of 556 nm at each of the measurement times was shown in FIG. 3. After the light irradiation for the first 10 minutes, the fluorescence intensity decreased to 60% of the original intensity, and, after the light irradiation for 10 hours, the fluorescence intensity decreased to about 14% the original intensity. From the results, it was understood that the fluorescence intensity of the film of the poly(arylenevinylene) polymer can be continuously changed by adjusting the time for irradiation with light or the intensity of the irradiation light.

EXAMPLE 3

Figure 4:
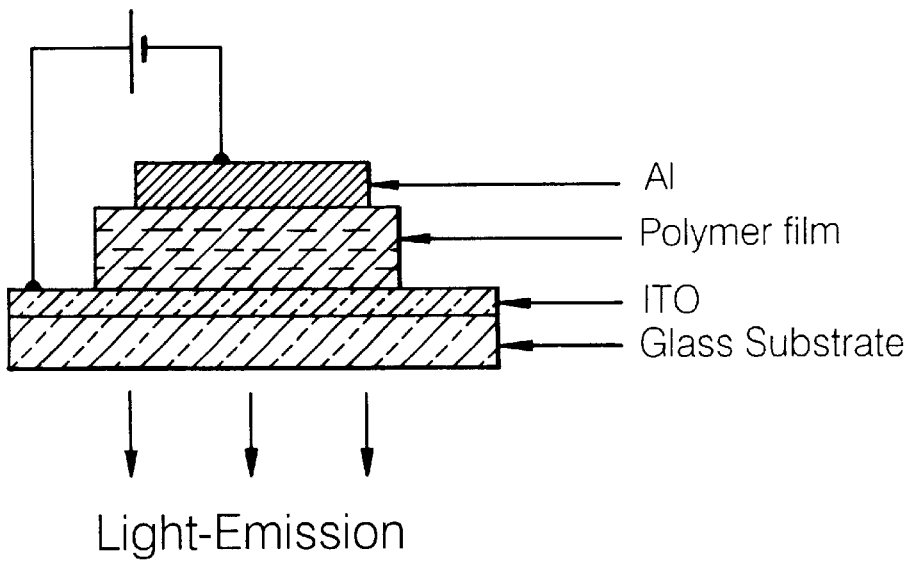
FIG. 4 is a cross-sectional drawing of the organic EL device obtained in Example 3.
Figure 5:
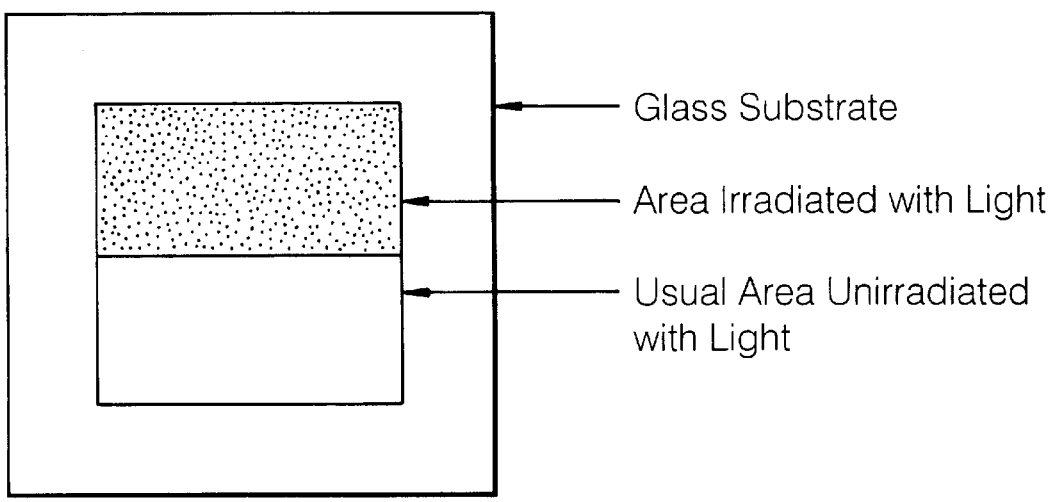
FIG. 5 is a plane drawing of a polymer film in the organic EL device obtained in Example 3.

A film of poly(phenylenevinylene) having a film thickness of 100 nm was formed on a well-rinsed ITO-coated glass substrate in the same manner as in Example 1, and, on the resulting polymer film, an aluminum electrode having a film thickness of 150 nm with an area of 2 mm×2 mm was vapor-deposited by resistant heating under a vacuum of 5 to $6 \times 10^{-6}$ torr. Thereafter, the polymer film was irradiated in a half area of the aluminum electrode with light from a xenon lamp (output 700 W) through the glass surface for 15 minutes in air. The thus-produced EL device is shown in FIG. 4 and FIG. 5 and is composed of usual poly(phenylenevinylene) in a half portion and light-treated poly(phenylenevinylene) in another half portion, i.e., poly(penylenevinylene) having a decreased fluorescence intensity. Then, a positive electric field was applied to the ITO electrode and a negative electric field was applied to the aluminum electrode of the organic EL device, and the luminous intensity in the light-treated portion and the light-untreated portion of the device relative to the intensity of the electric field was measured by using a color brightness meter (Model BM-7 of Topcon Corporation). The results obtained are shown in FIG. 6. As shown in FIG. 6, the light-emission from the light-untreated portion is stronger than that of the light-treated portion, and, when an electric field of 12V is applied, the ratio of the intensity thereof was about 8:1. From the above result, it was found that, in the organic EL device, the light-emission from the portion where the light-emission was not required could be suppressed by light-irradiation and, as a result, the organic EL device could be patterned by the irradiation with light.

INDUSTRIAL APPLICABILITY

According to the present invention, the fluorescence intensity of a poly(arylenevinylene) polymer film can be decreased in stages by irradiation with light, and, accordingly, the present invention provides a process for forming a fluorescent pattern on a poly(arylenevinylene) polymer film, a poly(arylenevinylene) polymer film having a fluorescent pattern, as well as an organic EL device comprising a patterned poly(arylenevinylene) polymer film.

What is claimed is:

1. A process for forming a pattern which comprises irradiating with light a film of a poly(arylenevinylene) polymer represented by formula (I)

wherein Ar is a substituted or unsubstituted divalent aromatic hydrocarbon group or a substituted or unsubstituted divalent heterocyclic ring group, and the aromatic hydrocarbon group and the heterocyclic ring group may be a fused ring, $R^1$ and $R^2$, independently of each other, are selected from the group consisting of H, CN, alkyl, alkoxy, a substituted aromatic hydrocarbon group, an unsubstituted aromatic hydrocarbon group, a substituted aromatic heterocycle group and an unsubstituted aromatic heterocycle group, wherein the unsubstituted or substituted aromatic hydrocarbon group and the unsubstituted or substituted aromatic heterocyclic group may be fused rings, and n is an integer from 5 to 30.000.

2. The process as claimed in claim 1, wherein $R^1$ und $R^2$ in the formula (I) are H.

3. The process as claimed in claim 1, wherein a xenon or mercury lamp is used for irradiation.

4. The process as claimed in claim 1, wherein the polymer film is irradiated through a mask.

5. The process as claimed in claim 1, wherein the polymer film has a thickness of from 1 nm to 1000 nm.

6. The process as claimed in claim 1, wherein the difference in the intersity of the electroluminescence between the non-irradiated and irradiated parts of the film is at least 8 to 1.

7. A patterned poly(arylenevinylene) polymer film produced by the process according to claim 1.

8. An organic electroluminescent device comprising a layer of a patterned poly(arylenevinylene) polymer film produced by the process according to claim 1.

* * * * *